United States Patent [19]
Brady

[11] Patent Number: 5,942,951
[45] Date of Patent: Aug. 24, 1999

[54] METHOD AND APPARATUS FOR REDUCING A NOISE DIFFERENTIAL IN AN ELECTRONIC CIRCUIT

[75] Inventor: James Brady, Plano, Tex.

[73] Assignee: STMicroelectronics, Inc., Carrollton, Tex.

[21] Appl. No.: 08/814,332

[22] Filed: Mar. 11, 1997

[51] Int. Cl.[6] .................................................. H03B 5/12
[52] U.S. Cl. ................................ 331/108 D; 331/108 C; 331/116 FE
[58] Field of Search ......................... 331/108 D, 108 C, 331/158, 108 B, 105, 116 R; 365/51, 63

[56] References Cited

U.S. PATENT DOCUMENTS

| | | | |
|---|---|---|---|
| 3,593,042 | 7/1971 | Cook, Jr. ................................. | 307/261 |
| 4,827,226 | 5/1989 | Connell ............................. | 331/116 FE |
| 5,369,377 | 11/1994 | Benhamida ................................ | 331/49 |
| 5,453,719 | 9/1995 | Narahara ................................... | 331/49 |
| 5,535,152 | 7/1996 | Han et al. .................................. | 365/51 |

*Primary Examiner*—David Nelms
*Assistant Examiner*—Tuan T. Nguyen
*Attorney, Agent, or Firm*—Theodore E. Galanthay; Lisa K. Jorgenson; AnAndre M. Szuwalski

[57] ABSTRACT

In a high current, high frequency integrated circuit chip characteristic of producing an excess of internal on-chip circuit induced noise with respect to a low current, low frequency circuit implemented on the high current, high frequency integrated circuit chip, a method is disclosed for reducing noise in the low current, low frequency circuit. The method includes placing noise sensitive components of the low current, low frequency circuit external to the integrated circuit chip, corresponding to an off-chip placement. An exclusive power supply reference line $V_{(REF)}$ tapped off of a power supply bus internal to the integrated circuit chip is provided. The exclusive power supply reference line $V_{(REF)}$ is tapped off the internal power supply bus on-chip at a physical location proximate the low current, low frequency circuit and routed off-chip. The noise sensitive components are connected between the low current, low frequency circuit and the power supply reference line $V_{(REF)}$, wherein a noise differential in a power supplied to the low current, low frequency circuit on-chip and a power supplied to the noise sensitive components off-chip is minimized. An integrated circuit arrangement is also disclosed.

34 Claims, 4 Drawing Sheets

METHOD AND APPARATUS FOR REDUCING A NOISE DIFFERENTIAL IN AN ELECTRONIC CIRCUIT

BACKGROUND OF THE INVENTION

1. Field of the Invention

This invention relates generally to a method and apparatus for reducing noise in a low current circuit, and more particularly, for reducing noise in a low current circuit included within a high current, high frequency integrated circuit chip.

2. Discussion of the Related Art

Oscillators for use in semiconductor clock chips operate at very low current levels, in the range of hundreds of nanoamps. An example of such a semiconductor clock chip includes, for example, a real time clock chip such as part number M48T86, commercially available from SGS-Thomson Microelectronics, Inc. of Carrollton, Tex. To obtain an optimal performance at the very low current levels in the range of hundreds of nanoamps, noise considerations become a serious concern. To address noise considerations, all of the oscillator components, with the exception of the oscillator crystal, are typically located "on-chip" in as low a noise environment as possible. Oscillator circuit supply voltages, Vss and Vcc, are provided to the oscillator circuit components using dedicated voltage supply lines. Furthermore, shielding is an important component of a design of a system clock chip having a low current oscillator circuit. Such a clock chip is also generally implemented in a low noise environment.

Computers and computer workstations typically utilize time keeper parts, i.e., clock chips. With respect to time keeper parts, the parts have a timing function which typically operates with the use of a crystal oscillator and further includes a battery back-up for when a main power is removed (i.e., turned off). Battery back-up enables the clock chip to continue to function even when the main power is off. Typically, the registers that record minutes, hours, days of the week, or days of the month, etc., remain active with the battery back-up so that when the system power comes back up, everything has been updated and is current. In other words, when power comes back up, the time keeper part or clock chip can read out the correct time and date, etc. A longevity of a particular battery recharge and/or battery life is dependent in part upon an amount of current required for operating the clock circuit when a main power is off.

With respect to computers and/or workstations, and in an effort to integrate as many functions as possible in as few chips as possible, it would be desirable to include a low current oscillator in a chip set for a particular microprocessor. The low current oscillator would enable an extended battery life when a main power is down. However, the chip set presents an extremely noisy environment for a low current oscillator to operate within. That is, the chip set includes a high current, high frequency noise environment. The low current oscillator is a fairly slow part, wherein the low current oscillator for a clock chip typically operates in the kilohertz range. A microprocessor and its corresponding chip set on the other hand, typically operate in the megahertz range.

In some instances, certain components of a particular circuit may not be capable of being manufactured on a single integrated circuit chip with a remainder of the integrated circuit components of the particular circuit due to semiconductor manufacturing process limitations. For example, a particular semiconductor manufacturing process may not allow for the formation of high precision capacitors of an oscillator circuit to be formed on the same chip as the main portion of the oscillator circuit, wherein the particular semiconductor manufacturing processor is principally for the making of microprocessors and/or microprocessor chip sets using a particular technology (e.g., 0.5 $\mu$m, 0.35 $\mu$m, 0.25 $\mu$m or less). As a result, the fabrication of the oscillator circuit must be split up, for example, wherein the non-process conforming capacitors are required to be fabricated off-chip. This is a disadvantage, since it would be desirable to make the oscillator circuitry all on a single chip where a very tight control can be exercised over the process used in making the oscillator circuit portion of the integrated circuit chip.

As indicated above, an oscillator circuit may be desirable for inclusion into an integrated circuit chip of a computer chip set, wherein the environment of the integrated circuit chip of the computer chip set is extremely noisy. In the instance of a low current oscillator circuit, which includes two capacitors connected to each side of an oscillator crystal to a power supply ground Vss, the capacitors may require a precision that is not available in some semiconductor manufacturing processes. For example, the capacitors may be fairly large, having a size dimension on the order of 100 $\mu$m per side. Such large capacitors require extra processing steps which may not be easily incorporated into or desirable to be included into the same integrated circuit manufacturing process as the integrated circuit chip of a computer chip set. In addition, incorporating the capacitors into the same manufacturing process may affect yield and would also increase the manufacturing costs of the integrated circuit because of the extra processing steps required. Specific requirements may also require that the capacitors from both crystal nodes to Vss be located outside of the chip (i.e., off-chip). In such an extremely noisy environment, the Vss located outside of the chip will have a different absolute value when compared to the same signal inside the chip. Such a difference adversely affects the timing operability of the low current oscillator circuit.

Turning now to FIG. 1, a circuit board 10 is shown having a high current, high frequency integrated circuit chip package 12 mounted thereon. Circuit board 10 contains numerous conductors for interconnection of various component parts. The conductors include, for example, a board level power supply positive potential Vcc line 14 and a board level power supply ground Vss line 16. Package 12 is connected to circuit board 10 via standard techniques.

Referring still to FIG. 1, package 12 includes a high current, high frequency integrated chip 18 mounted thereon. Chip 18 is interconnected with package 12 using bond wires 20, for example, or any other suitable interconnection known in the art. Chip 18 further includes a slow speed, low current oscillator circuit portion 22 integrated therewith. Low current oscillator circuit 22 includes a crystal 24 and capacitors 26, 28 mounted external to chip 18 and package 12 (i.e., off-chip). Capacitors 26, 28 are mounted on circuit board 10, each respectively connected between an opposite end of crystal 24 and board supply ground Vss 16.

Integrated circuit chips are typically bonded to a package and the package is bonded to a circuit board. Any number of integrated circuit chip connections may be employed. Electrical interconnection between the package and the semiconductor chip can be made using wirebonding, flip-chip, thermally activated bonding, solder bumps, and/or other chip-to-package interconnect techniques known in the art. The package includes any suitable input/output connection for getting signals into or out of an attached integrated circuit chip. The package is furthermore interconnected with the circuit board using any suitable techniques known in the art.

A typical frequency of operation of the low current oscillator circuit as discussed herein on the order of tens of kilohertz and more particularly, for example, 32,768 Hz. Such a low current oscillator circuit uses a very low frequency crystal. In a situation wherein the low current oscillator circuit is not able to be entirely fabricated within a desired integrated circuit chip because of semiconductor manufacturing process limitations, as discussed, the environment for which the low current oscillator circuit is intended may include a high current, high frequency environment. Such a high current, high frequency environment typically operates in the megahertz range (e.g., in the tens of megahertz range such as 33, 66, and 100 MHZ, etc.) and includes, for example, a computer or microprocessor chip set. Noise within the integrated circuit chip of a computer chip set will thus be in the very high frequency range. From the above, note that there are quite a few orders of magnitude difference in the operating range of the low current oscillator circuit and the frequency of the noise. The output signal 32 of a low current oscillator circuit without noise is generally in the form of a sine wave, as shown in FIG. 4. Without noise, a trip point 80 is easily recognized, wherein the trip point 80 is determined by the intersection of the oscillator output signal with a prescribed voltage trip level 82. The output signal 34 of a low current oscillator circuit with high frequency noise induced in the output signal is shown, for example, as illustrated in FIG. 5. Note that in FIG. 5, a trip point 84 is not easily recognized in view of the high frequency noise on the oscillator output signal. In reality, the high frequency noise is much greater than that shown.

In general, most of the function of a clock chip is not sensitive to noise, except with respect to the obtaining of an oscillator signal. Once obtained, the oscillator signal is typically divided down to where it starts to pick up amplitude and swings rail-to-rail (i.e., from Vss to Vcc), as is known in the art. The most sensitive portions of a clock chip are the oscillator and the first couple of divider circuits. If noise is introduced into an input of a divider stage, the noise is liable to trip (i.e., trigger) that particular stage multiple times, when the input should only trip that particular stage once as the oscillator circuit output signal passes through the transition or trip point. Power supply connections to a particular high current, high frequency integrated circuit chip are typically achieved using many external power supply pin inputs (not shown). The external pin inputs correspond, for example, to Vss (supply ground) and Vcc (supply voltage). The many external pin inputs are connected to corresponding internal busses on-chip to reduce the amount of power supply noise to an amount on the order of volts, more particularly, on the order of hundreds of millivolts.

In the situation where a power supply is provided to the high current, high frequency chip 18, the power supply can have an absolutely clean output signal, i.e., the output has no appreciable noise on it. By the time the power goes through a combination of the package pins, bond wires, and onto the semiconductor chip die, the clean power supply output signal would no longer be clean. Instead, the power supply signal would have an appreciable amount of noise on it due, for example, to an RCL characteristic of conductive leads and a switching which occurs on the chip. The switching is a function of an output switching of logic circuitry on the chip. On high speed chips, as many as 50–75% (fifty to seventy-five percent) of the outputs typically may be switching at any one time. A chip set for a microprocessor includes such high speed chips, wherein the chip set is used to establish an the environment for the microprocessor (or processor) to function, in accordance with a particular computer and/or computer architecture.

Numerous sources of noise generation exist on-chip. As mentioned above, even if the power supply to the chip was clean (i.e., contained no noise), by the time the power gets onto the chip, there would be noise in the power supply signal. This results in part from inductances on chip connection leads, resistances in conductors and connections, in addition to switching which occurs on-chip, leading to a very noisy environment. FIG. 2 is illustrative of the RCL circuit characteristics of resistance, capacitance, and inductance of the conductive paths. FIG. 3 further illustrates oscillator circuit 22 integrated with chip 18, circuit 22 further including crystal 24 and capacitors 26, 28 connected external to integrated circuit chip 18. Capacitors 26, 28 are connected between opposite ends of crystal 24, respectively, and board Vss supply 16. The current $i_{IN}$ off-chip will be different from on-chip current $i_{(chip+OSC)}$ as a result of circuit induced noise from the high current, high frequency, integrated circuit chip 18. FIG. 3 further illustrates the RCL characteristic 30 of the conductive interconnections.

With respect to typical on-chip busses of an integrated circuit chip, noise is dependent upon the specifics of the particular chip. The particular noise can be as much as a volt. With well designed integrated circuit chips, using numerous power supply pins, noise may be maintained to within a level on the order of several tenths of volts. Noise is thus dependent upon numerous factors, including, a particular function of the chip, the particular characteristics of the chip, and upon particular portions of the circuits on the chip which may happen to be operating at any one time, e.g., whether or not there is high speed switching occurring. Functionality of the circuitry on a chip also adds to the noise on the chip, e.g., high current, high frequency circuits, etc.

Referring again to FIG. 1, the slow speed, low current oscillator 22 is integrated on the high current, high frequency chip 18. A noise generated on-chip during operation of the chip 18 could upset the oscillator 22 and a corresponding clock function. In other words, noise problems would occur. While the oscillator circuitry 22 would occupy a small portion of the silicon of the very high speed chip 18, the oscillator circuitry 22 would reside in an environment which has very high switching speeds (i.e., in a range of less than 15 nsec (nanoseconds)). The environment is thus very noisy in terms of the low current, low noise oscillator 22. An amount of excursion at the output of the oscillator 22 is very small, on the order of 0.5 to 1 volt peak to peak with a noise margin on the order of millivolts. A typical output of an oscillator circuit is a sine wave, wherein the excursion amount is plus or minus some amount of volts or milivolts of signal.

It would be highly desirable to reduce a difference between an absolute value of a power supply ground Vss located outside a chip and a power supply ground inside the chip wherein the chip is characterized by a high current, high frequency noise environment.

SUMMARY OF THE INVENTION

It is an object of the present invention to overcome the noise problems in connection with a low current circuit implemented within a high current, high frequency integrated circuit chip, as discussed above.

In accordance with one embodiment of the present invention, with respect to a high current, high frequency integrated circuit chip characteristic of producing an excess of internal on-chip circuit induced noise with respect to a low current, low frequency circuit implemented on the high current, high frequency integrated circuit chip, a method is disclosed for reducing noise in the low current, low frequency circuit. The method includes placing noise sensitive components of the low current, low frequency circuit external to the integrated circuit chip, corresponding to an off-chip placement. An exclusive power supply reference line $V_{(REF)}$ tapped off of a power supply bus internal to the integrated circuit chip is provided. The exclusive power supply reference line $V_{(REF)}$ is tapped off the internal power supply bus on-chip at a physical location proximate the low current, low frequency circuit and routed off-chip. The noise sensitive components are connected between the low current, low frequency circuit and the power supply reference line $V_{(REF)}$, wherein a noise differential in a power supplied to the low current, low frequency circuit on-chip and a power supplied to the noise sensitive components off-chip is minimized.

In accordance with another embodiment according to the present invention, an integrated circuit arrangement is disclosed. The integrated circuit arrangement is for reducing noise in a low current, low frequency circuit implemented on a high current, high frequency integrated circuit chip. The high current, high frequency integrated circuit chip is characteristic of producing an excess of internal on-chip circuit induced noise with respect to the low frequency, low current circuit. The integrated circuit arrangement includes noise sensitive components of the low current, low frequency circuit placed external to the integrated circuit chip, corresponding to an off-chip placement. In addition, an exclusive power supply reference line $V_{(REF)}$ is tapped off of a power supply bus internal to the integrated circuit chip. More particularly, the exclusive power supply reference line $V_{(REF)}$ is tapped off the internal power supply bus at a physical location proximate the low current, low frequency circuit and further routed off-chip. The exclusive power supply reference line $V_{(REF)}$ is connected to the noise sensitive components, wherein the noise sensitive components are connected between the low current, low frequency circuit on-chip and the exclusive power supply reference line $V_{(REF)}$, wherein a noise differential in a power supplied to the low current, low frequency circuit on-chip and a power supplied to the noise sensitive components off-chip is minimized.

BRIEF DESCRIPTION OF THE DRAWINGS

The foregoing and other teachings and advantages of the present invention will become more apparent upon a detailed description of the best mode for carrying out the invention as rendered below. In the description to follow, reference will be made to the accompanying drawings, where like reference numerals are used to identify like parts in the various views and in which.

DETAILED DESCRIPTION OF A PREFERRED EMBODIMENT OF THE INVENTION

The present invention addresses and solves the problems associated with noise and how to implement a low current oscillator circuit on a high current, high frequency chip for overcoming the noise issues. According to the present invention, the noisy environment of the high current, high frequency chip is advantageously used and taken outside the chip. That is, the present invention advantageously taps off of a power supply line in the noisy environment, as discussed further herein below.

Figure 1:
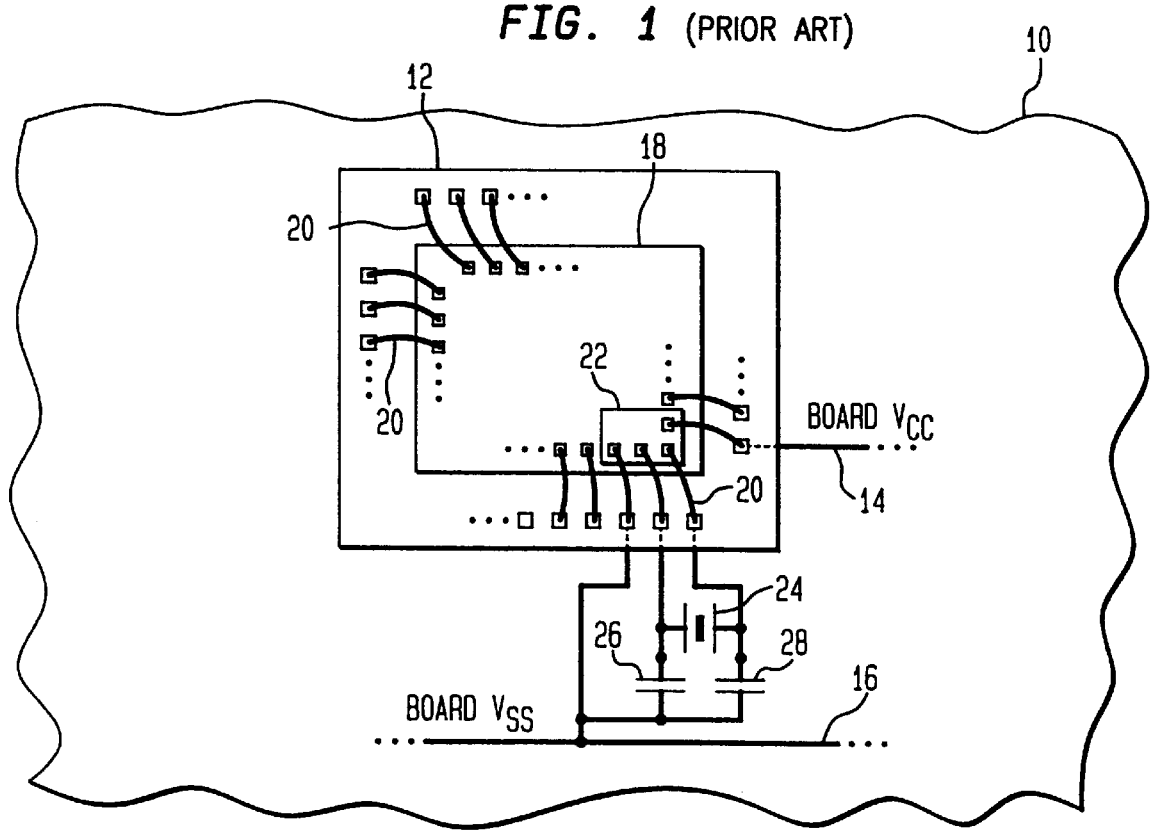
FIG. 1 illustrates a top plan view of an integrated circuit chip mounted on a package, further mounted on a circuit board having critical circuit components connected to a board level power supply ground Vss.
Figure 2:
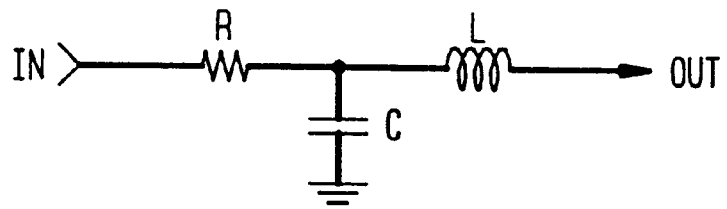
FIG. 2 illustrates an RCL circuit of resistance, capacitance, and inductance of conductive paths from a circuit board to an integrated circuit chip.
Figure 4:
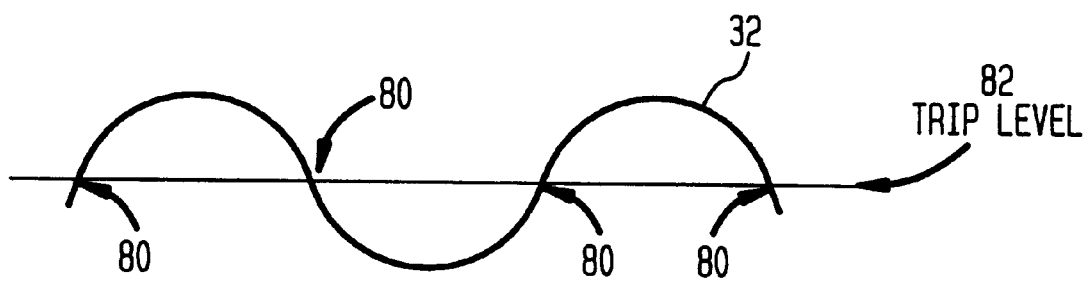
FIG. 4 illustrates a sinusoidal output of a low current oscillator circuit having no noise.
Figure 5:
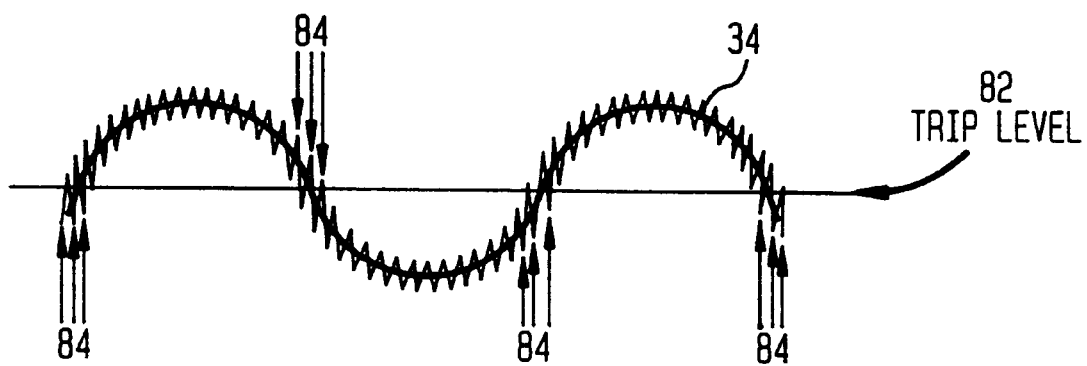
FIG. 5 illustrates a sinusoidal output of a low current oscillator circuit having very high frequency noise.
Figure 3:
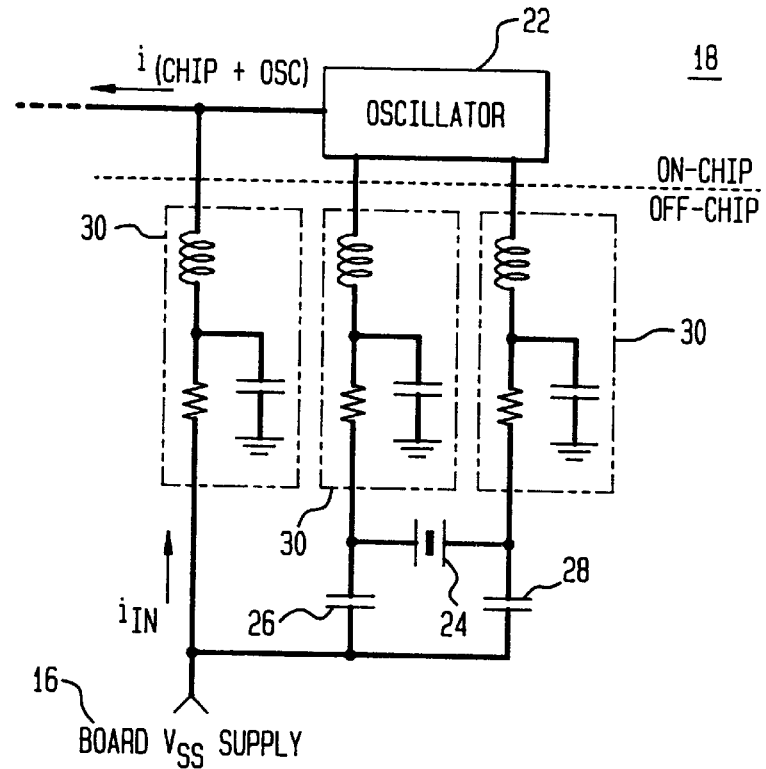
FIG. 3 illustrates an oscillator circuit integrated with an integrated circuit chip, the oscillator circuit including a crystal and corresponding capacitors connected external to integrated circuit, further coupled with the board level Vss supply ground.
Figure 6:
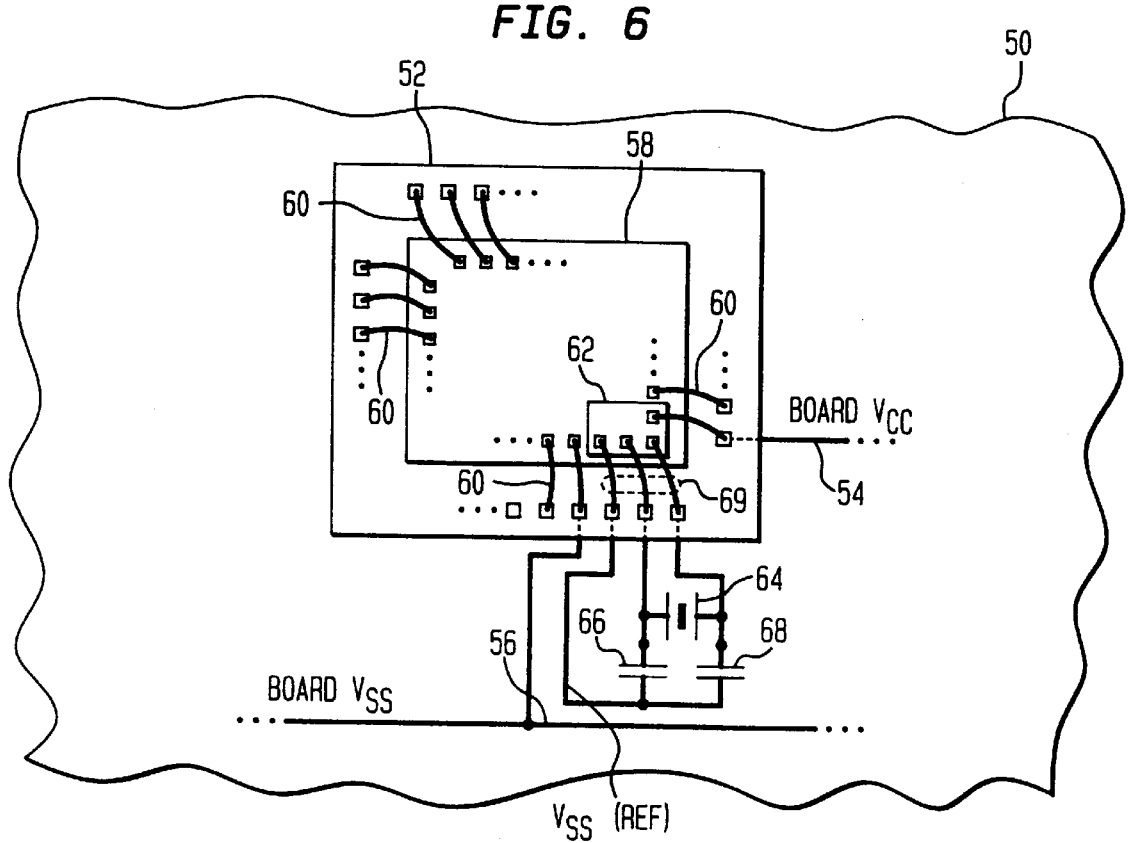
FIG. 6 shows a plan view of the present invention of a high current, high frequency integrated circuit chip having a low current oscillator circuit with external crystal and corresponding capacitors coupled to an off-chip reference supply ground Vss in accordance with the present invention.

Referring now to FIG. 6, a printed circuit board 50 includes an integrated circuit chip package 52 mounted thereon. Circuit board 50 further includes a board level power supply Vcc line 54 and a board level power supply ground Vss line 56. Package 52 includes a high current, high frequency integrated circuit chip 58. Chip 58 is bonded and interconnected to package 52 via any suitable interconnections known in the art, for example, via bond wires 60.

Figure 7:
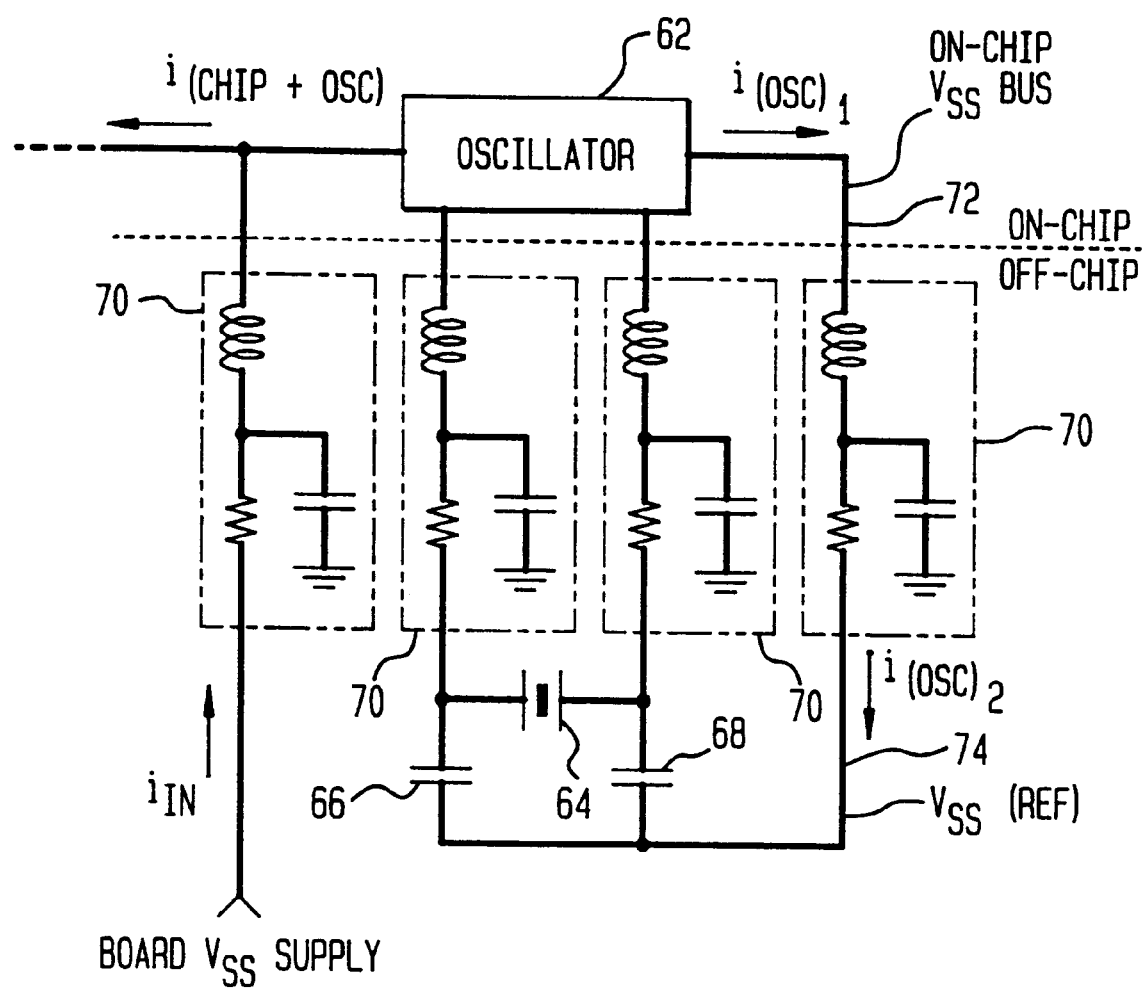
FIG. 7 illustrates a low current oscillator circuit integrated with an integrated circuit chip, the oscillator circuit including a crystal and corresponding capacitors connected external to the integrated circuit to an off-chip reference supply ground Vss in accordance with the present invention.

Referring still to FIG. 6, in accordance with the present invention, a reference ground supply $Vss_{(REF)}$ is taken off-chip, in which a crystal 64 and corresponding capacitors 66, 68 of an on-chip low current oscillator circuit 62 are attached thereto. The reference ground supply $Vss_{(REF)}$ taps off of a ground power bus within the chip 58 in the proximity of the necessary connection of the off-chip crystal 64 and corresponding capacitors 66, 68 to the on-chip oscillator circuit 62. The reference ground supply $Vss_{(REF)}$ taken off-chip is thus referencing what is actually happening inside the chip or die 58 (i.e., on-chip). The reference ground supply $Vss_{(REF)}$ is thus advantageously used for the ground reference of the two external capacitors 66, 68 and crystal 64 portion of the oscillator circuit. The differential in ground supply lines (i.e., noise differential) of (i) the oscillator circuit on-chip 62 and (ii) the crystal 64 and capacitors 66, 68 portion of the oscillator circuit off-chip is thus advantageously kept to a minimum. A current in the lines designated by reference numeral 69 (FIG. 6) are very low and differential voltages on these lines will be very small. An RCL characteristic 70 of conductive interconnections is shown in FIG. 7. A common mode noise in the respective ground supply lines of (i) the oscillator circuit on-chip 72 and (ii) the crystal and capacitors portion of the oscillator circuit off-chip 74 would cancel out, so that the difference between the two ground points, on-chip 72 and off-chip 74, respectively, for the oscillator circuit 62 would be very close to zero. One reason for this is that the oscillator circuit is a low current circuit in the microamp to nanoamp range, thus very little current flows through the two external off-chip capacitors. More particularly, the oscillator circuit requires less than a microamp of current. The present invention advantageously brings the noisy environment off-chip in a desired location, wherein the external reference ground supply $Vss_{(REF)}$ contains noise equal to or substantially equal to the internal noise, at the location on-chip proximate the oscillator circuitry 62, as much as possible. An integrity of the operation of the oscillator circuit 62 is thus maintained even in the presence of on-chip noise.

Referring again to FIG. 6, power supply signal 56 is provided to the integrated circuit chip 58, introduced into a noisy environment, and then brought off-chip from an area of the chip proximate to where the reference is needed for connecting to the external component parts of the on-chip low current oscillator circuitry 62. For discussion purposes, as shown, the external component parts correspond to the crystal 64 and two capacitor 66, 68 circuit arrangement of the low current oscillator 62. In other words, the area where the reference supply ground $Vss_{(REF)}$ is brought off-chip is proximate to a physical location where the external components are needed for connection with the oscillator circuit 62 internal to the integrated circuit chip 58. The reference supply ground $Vss_{(REF)}$ is brought off-chip close to where a connection is made to the circuitry internal to the chip which is referencing the grounded capacitors. The reference power supply ground $Vss_{(REF)}$ is a dedicated external off-chip supply line connecting only to the crystal 64 and two capacitor 66, 68 off-chip arrangement. The external off-chip reference power supply ground $Vss_{(REF)}$ is further used for no other purpose. If the reference supply ground $Vss_{(REF)}$ were taken from any other areas or portions of the integrated circuit chip different from and not proximate to the on-chip low current oscillator circuitry 62, then the off-chip reference supply ground and the ground for the on-chip low current oscillator circuitry could look entirely different.

A noise level tolerance of an on-chip low current oscillator circuit 62 can be as low as on the order of millivolts. The specific noise tolerance of an oscillator will depend upon its particular design. In contrast, the type of noise tolerable and concerned with the input power of the high current, high frequency chip 58, versus the type of noise with respect to a low current oscillator 62, is several orders of magnitude difference. The difference between the noise on the supply ground Vss 56 at the oscillator circuit on-chip and the noise on the reference supply ground $Vss_{(REF)}$ off-chip for the two capacitors of the external off-chip crystal 64 and two capacitor 66, 68 arrangement of the low current oscillator circuit 62 is needed to be on the order of millivolts. Such a small difference is needed to assure an optimal performance operation of the low current oscillator circuit on-chip.

Irregardless of how the integrated circuit is connected to a corresponding package and how the package is connected to a corresponding circuit board, if there exists noise inside the chip (i.e., internal to the chip) which is objectionable to a critical circuit portion of a circuit on the chip, then, in accordance with the present invention, the noise is advantageously brought off the chip (off-chip). In accordance with the present invention, the noise is brought off-chip as a reference supply signal in a location proximate a physical location of the critical circuit portion for exclusive use with the critical circuit portion and corresponding external off-chip components of the critical circuit portion.

As previously described, the system power supply Vss is externally supplied to the integrated circuit chip 58 via external circuit board/package/chip interconnections. The system power supply Vss is also supplied to the chip in numerous locations on one or more sides of the chip as may be required, wherein all of the locations may be connected together internally. Once on-chip, the power supply Vss is supplied to various parts of the chip via various internal busses and/or on-chip conductors, in accordance with the particular integrated circuit chip design. The present invention advantageously taps off of the internal power supply $Vss_{(REF)}$ bus on-chip at a location proximate to where the reference supply Vss is needed, as discussed herein.

Problems associated with noise in the power supply signal are thus effectively reduced. That is, a dedicated reference supply $Vss_{(REF)}$ is tapped off of an internal Vss bus at a location proximate to where the reference supply $Vss_{(REF)}$ is required for connecting with an external component or components of a particular noise sensitive circuit of the integrated circuit chip. In other words, in the example of the low current oscillator circuit 62, the location where the reference supply $Vss_{(REF)}$ comes off the chip 58 is proximate a physical location where an internal Vss ground is for the oscillator circuit 62 that the crystal 64 works with. The present invention provides an improvement over a mere supplying of a dedicated clean board level supply Vss to the integrated circuit chip.

In addition, once off-chip, the reference supply $Vss_{(REF)}$ is routed for connection with the external capacitors 66, 68 using a minimal sized line, spaced at a minimal distance from the package. The reference supply $Vss_{(REF)}$ is further routed onto the circuit board 50 to where it is connected with the capacitors 66, 68 using appropriate shielding and further in a very controlled manner.

In accordance with the present invention, a Vss line is taken from inside the chip and routed outside the chip so as to become a dedicated reference supply ground $Vss_{(REF)}$ line. Such a reference supply ground $Vss_{(REF)}$ line advantageously follows any noise present on the Vss line inside the chip at the oscillator circuit. The current $i_{(OSC)2}$ (FIG. 7) on the reference supply ground $Vss_{(REF)}$ line 74 is dedicated for use only with the two previously mentioned capacitors. The current in the reference supply ground $Vss_{(REF)}$ line is smaller than a total oscillator current, thus a differential voltage is minimized. That is, the reference supply ground $Vss_{(REF)}$ line current $i_{(OSC)2}$ is small enough that, implemented with good engineering practice, the dedicated reference ground supply $Vss_{(REF)}$ will follow the internal Vss with very little differential voltage difference. Current $i_{(OSC)2}$ will be approximately equal to current $i_{(OSC)1}$.

A schematic circuit as shown in FIG. 7 is illustrative of the method and apparatus of the present invention. As shown in FIG. 7, note that in the schematic circuit, the capacitors 66 and 68, located off-chip, are not connected to the board Vss but are instead connected to the reference supply ground $Vss_{(REF)}$ line that is the actual Vss at the oscillator circuit on-chip.

With respect to the low current oscillator 62, a current in the bond wires extending from the substrate to the integrated circuit chip bond pads is very low. The differential voltages on the respective lines will be very small as a result, having differential voltages on the order of millivolts and more particularly, tens of millivolts. The particular bond wires of interest are illustrated in FIG. 6, as indicated by reference numeral 69.

Each bond wire or metal trace within the integrated circuit chip and any traces on the circuit board are actually RCL circuits. As discussed herein, the operating frequency of the oscillator is low enough that it will have a minimal effect on the equivalent RCL circuit components as they relate to the bond wires or metal traces connected with the oscillator circuit. In addition, while there is a slight difference in the on-chip Vss proximate the oscillator circuit on-chip and the off-chip Vss$_{(REF)}$ because of the RCL characteristic, the amount of current i$_{(OSC)2}$ on the Vss$_{(REF)}$ line is so small that it does not introduce any new appreciable increase in the noise (i.e., voltage signal difference) than would otherwise be there. This emphasizes that the embodiment according to the present invention does not introduce any appreciable additional noise using the off-chip Vss$_{(REF)}$.

The present invention thus enables a low current oscillator circuit to be integrated with a high current, high frequency integrated circuit chip, wherein the oscillator provides a clean output signal at a desired trip point. This is in contrast to the situation in which the oscillator output signal contains high frequency noise and a recognition of the signal trip point is not clean.

While the present invention has been described with respect to an oscillator circuit, it is also applicable to other circuit arrangements having elements which are sensitive to noise. For example, other circuit arrangements may include any type of analog circuit such as an op-amp with a low differential offset on the order of millivolts. The present invention is thus applicable for use with circuit arrangements requiring less than a noise differential possible between an is external and an internal environment on a chip.

As mentioned above, the present invention is applicable to circuits requiring a low differential offset in noise on a power supply line between an on-chip supply and an off-chip supply. The particular low differential offset is less than a noise differential possible between an internal and an external supply of a particular chip. Furthermore, the applicable circuits include those in which a majority portion of the particular circuit is implemented on-chip and a minority portion of the particular circuit is implemented off-chip.

While the present invention has further been described with respect to using the supply ground Vss, the present invention is also applicable to the use of supply potential Vcc. The particular crystal used in the oscillator circuit implementation is selected in accordance with the requirements and specifications of a particular oscillator circuit. The circuit elements of the low current oscillator circuit external to the chip (i.e., off-chip) include high precision capacitors.

The present invention thus advantageously eliminates problems associated with noise by bringing a reference supply ground Vss$_{(REF)}$ off-chip. In the case of a low current oscillator circuit 62, two high precision capacitors 66, 68 in conjunction with a crystal 64 are connected with the off-chip reference supply ground Vss$_{(REF)}$. The off-chip reference supply ground Vss$_{(REF)}$ is used exclusively for connecting with the two high precision capacitors, and for no other connections.

Further, as briefly discussed herein above with respect to a battery back-up, to keep a desired circuit operational when Vcc goes away (i.e., main power is off), there is typically a battery associated with the integrated circuit chip. With the present invention, a low current oscillator circuit is capable of being implemented in a high current, high frequency noisy environment. Thus, the requirements for a particular size of battery necessary to operate the oscillator circuit are greatly reduced, in view of the oscillator circuit's low current requirements in the microamp to nanoamp range. The low current requirements advantageously provide for a maximum battery life.

While the invention has been shown and described with respect to an integrated circuit chip 58 mounted on a package 52, further mounted upon a circuit board 50, this should not be limiting. For example, the crystal 64 and capacitors 66, 68 could be mounted upon the package 52 but external to the chip 58, provided that the package 52 were of sufficient size for receiving the same.

The present invention thus deals with the integration of a low current circuit in a semiconductor chip of a high power chip set, wherein a portion of the circuit elements of the low current circuit, not capable of being integrated on a same chip, are off-chip. An off-chip connection includes a dedicated reference supply ground Vss$_{(REF)}$ for connection with the off-chip circuit elements of the low current circuit. The dedicated reference supply Vss$_{(REF)}$ is tapped off of an internal on-chip Vss bus at a physical location proximate to where the reference supply Vss$_{(REF)}$ is required for connecting with the off-chip external component or components of the low current noise sensitive oscillator circuit of the integrated circuit chip.

While the present invention has been described with respect to a low current oscillator circuit, the present invention is not limited to the same. That is, the present invention is equally applicable with respect to Vcc or any other node of a low current circuit on a semiconductor chip, wherever necessary, for providing an improved device (i.e., low noise) performance. As an example, if any component in the oscillator circuit is to be located outside of the semiconductor chip between a node which is common on both the inside of the chip and on the outside of the chip, the method of the present invention may be used to bring the chip node off-chip in a location where the node can be used with less circuit induced noise.

There has thus been shown a method and apparatus which provides reduced noise in a low current oscillator integrated on a high current, high frequency integrated circuit chip, such as, an integrated circuit chip of a computer chip set.

While the invention has been particularly shown and described with reference to specific embodiments thereof, it will be understood by those skilled in the art that various changes in form and detail may be made thereto, and that other embodiments of the present invention beyond embodiments specifically described herein may be made or practice without departing from the spirit and scope of the present invention as limited solely by the appended claims.

What is claimed is:

1. A method of reducing noise differential throughout a first circuit running at a first frequency and implemented primarily on an integrated circuit chip including a second circuit running at a second frequency which is greater than the first frequency, the integrated circuit receiving a power supply reference from an off-chip reference source through one or more reference source bond pads which are connected to a power supply reference bus on the integrated circuit chip, said method comprising the steps of:

placing noise sensitive components of the first circuit external to the integrated circuit chip, corresponding to an off-chip placement;

providing a first power supply reference line V$_{(REF)}$ tapped off of the power supply reference bus internal to the integrated circuit chip at a physical location proximate to the first circuit, and routing the first power supply reference line V$_{(REF)}$ off-chip; and connecting the off-chip noise sensitive components between the first circuit and the off-chip routed first power supply reference line V$_{(REF)}$ so that the on-chip power supply bus of the integrated circuit chip is connected between the off-chip reference source and the noise sensitive components.

2. The method of claim 1, wherein
the first circuit operates at a frequency in the range of kilohertz (KHz) up to tens of kilohertz, and
the second circuit of the integrated circuit chip operates at a frequency of at least one megahertz (MHZ).

3. The method of claim 1, wherein
the first circuit includes an oscillator circuit, and
the off-chip noise sensitive components include a crystal and two capacitors, the crystal coupled via conductors at opposite ends thereof to the oscillator circuit on-chip and the two capacitors each connected at one end thereof to a first end and an opposite end, respectively, of the crystal, the two capacitors further each connected at an opposite end thereof to the off-chip routed first power supply reference line $V_{(REF)}$.

4. The method of claim 1, wherein the first circuit has a noise level tolerance on the order of millivolts.

5. The method of claim 1, wherein
said first power supply ground reference line $V_{(REF)}$ includes an exclusive power supply ground reference $Vss_{(REF)}$.

6. The method of claim 1, wherein
said first power supply reference line $V_{(REF)}$ includes an exclusive power supply positive potential reference $Vcc_{(REF)}$.

7. The method of claim 1, wherein
the first power supply reference line $V_{(REF)}$ is routed off-chip in a location proximate to a physical location required for connection of the on-chip first circuit with the external noise sensitive components.

8. The method of claim 1, further comprising the steps of:
mounting the integrated circuit chip on a substrate package; and
mounting the substrate package onto a circuit board, wherein further the noise sensitive components are mounted onto the circuit board.

9. The method of claim 1, further comprising the step of:
mounting the integrated circuit chip and the noise sensitive components onto a single substrate package.

10. An integrated circuit arrangement for reducing noise differential throughout a first circuit operating at a first frequency and implemented on an integrated circuit chip including a second circuit operating at a second frequency which is greater than the first frequency, the integrated circuit receiving a power supply reference from an off-chip reference source through one or more reference source bond pads which are connected to a power supply reference bus on the integrated circuit chip, said integrated circuit arrangement comprising:
noise sensitive components of the first circuit placed external to the integrated circuit chip, corresponding to an off-chip placement; and
a first power supply reference line $V_{(REF)}$ tapped off of the power supply reference bus internal to the integrated circuit chip at a physical location proximate to the first circuit, said first power supply reference line $V_{(REF)}$ further routed off-chip and connected to said off-chip noise sensitive components, wherein said off-chip noise sensitive components are connected between the first circuit on-chip and said off-chip routed first power supply reference line $V_{(REF)}$ so that the on-chip power supply reference bus of the integrated circuit chip is connected between the off-chip reference source and the noise sensitive components.

11. The integrated circuit arrangement of claim 10, wherein
the first circuit operates at a frequency in the range of kilohertz (KHz) up to tens of kilohertz, and
the second circuit of the integrated circuit chip operates at a frequency of at least one megahertz (MHZ).

12. The integrated circuit arrangement of claim 10, wherein
the first circuit includes an oscillator circuit, and
said off-chip noise sensitive components include a crystal and two capacitors, the crystal coupled via conductors at opposite ends thereof to the oscillator circuit on-chip and the two capacitors each connected at one end thereof to a first end and an opposite end, respectively, of the crystal, the two capacitors further each connected at an opposite end thereof to said off-chip routed first power supply reference line $V_{(REF)}$.

13. The integrated circuit arrangement of claim 10, wherein the first circuit has a noise level tolerance on the order of millivolts.

14. The integrated circuit arrangement of claim 10, wherein
said first power supply reference line $V_{(REF)}$ includes an exclusive power supply ground reference $Vss_{(REF)}$.

15. The integrated circuit arrangement of claim 10, wherein
said first power supply reference line $V_{(REF)}$ includes an exclusive power supply positive potential reference $Vcc_{(REF)}$.

16. The integrated circuit arrangement of claim 10, wherein
said first power supply reference line $V_{(REF)}$ is routed off-chip in a location proximate to a physical location required for connection of the on-chip first circuit with said external noise sensitive components.

17. The integrated circuit arrangement of claim 10, further comprising:
a substrate package, wherein the integrated circuit chip is mounted on said substrate package; and
a circuit board, wherein said substrate package and said noise sensitive components are mounted onto the circuit board.

18. The integrated circuit arrangement of claim 10, further comprising:
a substrate package, wherein the integrated circuit chip and said noise sensitive components are mounted onto said substrate package.

19. The method of claim 1, further including the step of:
placing a bond pad for the first power supply reference line $V_{(REF)}$ on the integrated circuit chip adjacent to one or more bond pads connecting the first circuit on-chip to the noise sensitive components.

20. An electronic circuit, comprising:
an integrated circuit (IC) chip, a first portion of said IC chip operating at a first frequency and a second portion of said IC chip operating at a second frequency which is substantially lower than said first frequency, said IC chip including power supply reference bussing thereon for routing on-chip power supply reference signals to said first portion and said second portion of said IC chip;
a first supply reference signal line;
one or more electrical components, said one or more electrical components being placed off-chip relative to said IC chip and being electrically connected to said second portion of said IC chip, said electrical components being further electrically connected to said first supply reference signal line; and a means for substantially matching noise levels in said first supply reference signal line to noise levels appearing on said on-chip power supply reference bussing in proximity to said second portion of said IC chip.

21. The circuit of claim 20, further including:

an off-chip reference source bussing; and wherein said IC chip includes one or more reference source bond pads which are connected to said on-chip power supply reference bussing, said off-chip reference source bussing being electrically connected to said one or more reference source bond pads;

said first supply reference signal line is tapped off of said on-chip power supply reference bussing such that said on-chip power supply reference bussing is connected between said off-chip reference source bussing and said one or more off-chip electrical components.

22. The circuit of claim 20, wherein:

said second portion of said IC chip comprises circuitry located in a first area thereof;

said noise level matching means comprises said first supply reference signal line being tapped off of said on-chip power supply reference bussing in close proximity to said first area of said IC chip and routed off-chip; and off-chip electrical connections to said first supply reference signal line consists of electrical connections to said one or more electrical components.

23. The circuit of claim 22, wherein:

said electrical connections between said electrical components and said first supply reference signal line includes a first bond pad on said IC chip being in close proximity to said first area thereof; and electrical connections between said electrical components and said second portion of said IC chip include one or more second bond pads on said IC chip being adjacent to said first bond pad.

24. The circuit of claim 20, wherein:

said on-chip power supply reference bus from which said first supply reference signal line is tapped comprises a ground reference supply bus.

25. The circuit of claim 20, wherein:

said matching means comprises said first supply reference signal line being tapped from said on-chip power supply reference bussing proximally to said second portion of said IC chip so that said one or more electrical components are provided a power reference signal by said on-chip power supply reference bussing.

26. An electrical circuit, comprising:

an integrated circuit (IC) chip, a first portion of said IC chip operating at a first frequency and a second portion of said IC chip operating at a second frequency which is substantially lower than said first frequency, said IC chip including power supply reference bussing thereon for routing on-chip power supply reference signals to said first portion and said second portion of said IC chip;

one or more electrical components, said one or more electrical components being off-chip relative to said IC chip and being electrically connected to said second portion of said IC chip; and said one or more electrical components are connected to at least one power supply reference signal from said on-chip power supply reference bussing proximally to said second portion on said IC chip.

27. The circuit of claim 26, further including:

an off-chip reference source bus which is connected to said on-chip power supply reference bussing and supplies a reference source signal thereto;

a power supply reference signal line which is tapped off of said on-chip power supply reference bussing such that said on-chip power supply reference bussing is connected between said off-chip reference source bus and said one or more off-chip electrical components.

28. An electronic circuit, comprising:

an integrated circuit (IC) chip, comprising:
  a first portion;
  a second portion; and
  an on-chip power supply reference bussing for routing on-chip power supply reference signals to said first portion and said second portion;
  wherein said first portion generates a level of noise appearing on said on-chip power supply reference bussing;

a first reference signal line;

one or more electrical components, said one or more electrical components being off-chip relative to said IC chip and being electrically connected to said first reference signal line; and a means for substantially matching a noise level appearing on said first reference signal line to said level of noise appearing on said on-chip power supply reference bussing in proximity to said second portion.

29. The electronic circuit of claim 28, further including:

an off-chip reference source bus; and wherein said means for substantially matching noise levels comprises a tap line having a first end connected to said on-chip power supply reference bussing in proximity to said second portion and a second end being routed off of said IC chip and connected to said first reference signal line such that said on-chip power supply reference bussing is connected between said off-chip reference source bus and said first reference signal line.

30. The electronic circuit of claim 28, wherein:

said means for substantially matching noise levels comprises a tap line having a first end connected to said on-chip power supply reference bussing in proximity to said second portion and a second end being routed off of said IC chip and connected to said first reference signal line; and electrical connections to said first reference signal line consist of electrical connections to said one or more electrical components and said second end of said tap line.

31. The electronic circuit of claim 30, wherein:

said on-chip power supply reference bussing to which said first end of said tap line is connected is a ground reference supply bus.

32. The electronic circuit of claim 28, wherein:

said second portion comprises a second circuit located in a first area of said IC chip.

33. The electronic circuit of claim 30, wherein:

said second portion comprises a second circuit located in a first area of said IC chip; and said tap line includes a bond pad on said IC chip being in close proximity to said first area thereof.

34. The electronic circuit of claim 28, wherein:

said means for substantially matching noise levels comprises a tap line having a first end connected to said on-chip power supply reference bussing proximally to said second portion and a second end routed off of said IC chip and connected to said first reference signal line so that said one or more electrical components are provided a power reference signal by said on-chip power supply reference bussing.

* * * * *